US008633538B2

(12) United States Patent
Hayano

(10) Patent No.: US 8,633,538 B2
(45) Date of Patent: Jan. 21, 2014

(54) SEMICONDUCTOR DEVICE

(76) Inventor: Kiminori Hayano, Tokyo (JP)

( * ) Notice: Subject to any disclaimer, the term of this patent is extended or adjusted under 35 U.S.C. 154(b) by 131 days.

(21) Appl. No.: 13/207,947

(22) Filed: Aug. 11, 2011

(65) Prior Publication Data

US 2012/0037953 A1 Feb. 16, 2012

(30) Foreign Application Priority Data

Aug. 12, 2010 (JP) ................................ 2010-180951

(51) Int. Cl.
*H01L 29/66* (2006.01)

(52) U.S. Cl.
USPC ........... 257/328; 257/329; 257/360; 257/368; 257/E29.268

(58) Field of Classification Search
USPC ................... 257/328, 329, 360, 368, E29.268
See application file for complete search history.

(56) References Cited

U.S. PATENT DOCUMENTS

2009/0065856 A1 3/2009 Oyu et al.
2009/0085102 A1 4/2009 Takaishi

FOREIGN PATENT DOCUMENTS

JP 2009-065024 A 3/2009
JP 2009-081389 A 4/2009
JP 2009-283690 A 12/2009

*Primary Examiner* — Tan N Tran
(74) *Attorney, Agent, or Firm* — Sughrue Mion, PLLC

(57) ABSTRACT

A semiconductor device comprises a vertical MOS transistor including a semiconductor substrate having a silicon pillar, a gate electrode formed along a sidewall of the silicon pillar, a gate insulating film formed between the gate electrode and the silicon pillar, an upper diffusion layer formed on the top of the silicon pillar, and a lower diffusion layer formed lower than the upper diffusion layer in the semiconductor substrate; and a pad electrically connected to the lower diffusion layer. Breakdown occurs between the lower diffusion layer and the semiconductor substrate when a surge voltage is applied.

25 Claims, 13 Drawing Sheets

400
416
401b
402
401
431
412
401a
415
406
414
407
405
425
421
432
426
422
431
423
427
PAD
430
424
428
420
Qn4
Qb4a
Qb4b
Ty4

SEMICONDUCTOR DEVICE

REFERENCE TO RELATED APPLICATION

This application is based upon and claims the benefit of the priority of Japanese patent application No. 2010-180951, filed on Aug. 12, 2010, the disclosure of which is incorporated herein in its entirety by reference thereto. The present invention relates to a semiconductor device having a vertical MOS (Metal Oxide Semiconductor) transistor, and particularly to a semiconductor device using the vertical MOS transistor as an electrostatic discharge protection device.

BACKGROUND

As the miniaturization and high integration of semiconductor devices progress, semiconductor devices having vertical MOS transistors whose footprints, i.e. occupying area, are reducible, compared to planar (horizontal) MOS transistors, are proposed (for instance, refer to Patent Documents 1 and 2).

A vertical MOS transistor comprises a silicon pillar, a gate electrode formed around a sidewall of the silicon pillar so as to surround the silicon pillar, and a source and a drain formed over the silicon pillar and at the foot of the silicon pillar. In the vertical MOS transistor, the sidewall of the silicon pillar is a channel region. Such a vertical transistor is called SGT (Surrounding Gate Transistor).

Further, a semiconductor device normally has an ESD (Electro Static Discharge) protection device for protecting an internal circuit therein from surge voltage caused by electrostatic discharge (for instance, refer to Patent Document 3). For instance, the ESD protection device is connected to an external terminal and functions so that surge voltage from the external terminal is not applied to the internal circuit by clamping operation.

[Patent Document 1]

Japanese Patent Kokai Publication No. JP-P2009-65024A, which corresponds to US2009/065856A1

[Patent Document 2]

Japanese Patent Kokai Publication No. JP-P2009-81389A, which corresponds to US2009/085102A1

[Patent Document 3]

Japanese Patent Kokai Publication No. JP-P2009-283690A

SUMMARY

The following analysis is given from the standpoint of the present invention.

An ESD protection device can be constituted by using a MOS transistor as an ESD protection device described in Patent Document 3. In this case, when a MOS transistor formed in a semiconductor device is a vertical type, the MOS transistor used for the ESD protection device must be a vertical type as well. However, since vertical MOS transistors are new type transistors, they are insufficiently optimized for a semiconductor device, and when an ESD protection device is constituted by a vertical MOS transistor, the device is sometimes unable to protect elements to be protected and the ESD protection device itself may get damaged.

In an ESD protection device constituted by a MOS transistor, the clamping operation generally utilizes the breakdown characteristics of a PN junction between an impurity diffusion layer functioning as a source/drain electrode and a semiconductor substrate. Therefore, it is crucial to stabilize the breakdown characteristics for ESD protection. However, since variation or a decrease in breakdown voltage, caused by a vertical MOS transistor manufacturing method, occurs in a semiconductor device as shown in FIG. 13 (described later), it may sometimes fail to stabilize the breakdown characteristics.

An example of a method for manufacturing a semiconductor device having a vertical MOS transistor will be described. FIGS. 10A-11E show schematic process diagrams for explaining the example of the method for manufacturing a semiconductor device having a vertical MOS transistor. FIG. 12 shows a schematic projection for illustrating positional relations among elements in a vertical MOS transistor manufactured using this manufacturing method. FIGS. 10A-11E show a schematic cross section taken along a XIII-XIII line in FIG. 12.

First, an STI (Shallow Trench Isolation) insulating film 902 is formed on a semiconductor substrate 901 of a first conductivity type (for instance p-type; the same hereinafter) as an element isolation region using a silicon oxide film and the surface is planarized (FIG. 10A).

Next, a first silicon pillar 901*a* and a second silicon pillar 901*b* are formed by etching the semiconductor substrate 901. Before the semiconductor substrate 901 is etched, a first mask 903 and a second mask 904 are formed in regions on the semiconductor substrate 901 where the first silicon pillar 901*a* and the second silicon pillar 901*b* are formed (FIG. 10B). For instance, a silicon oxide film ($SiO_2$) can be used as the first mask 903, and a silicon nitride film ($Si_3N_4$) can be used as the second mask 904. The first silicon pillar 901*a* will be the main body (the channel part) of the vertical MOS transistor. The second silicon pillar 901*b* will be used for disposing a contact plug (described later) for providing a potential to a gate electrode of the vertical MOS transistor.

Next, a lower diffusion layer 905 is formed by injecting an impurity of a second conductivity type (for instance n-type; the same hereinafter) such as arsenic (As) into regions except for the first silicon pillar 901*a* and the second silicon pillar 901*b* by the ion implantation technique. The lower diffusion layer 905 functions as a source electrode or drain electrode. Next, thermal oxidation is performed, and an oxide film that will become a gate insulating film 906 is formed on sidewalls of the first silicon pillar 901*a* and the second silicon pillar 901*b* (FIG. 10C).

Next, a gate electrode precursor layer 907A of polycrystalline silicon containing an impurity such as phosphorus (P) is accumulated over the entire surface (FIG. 10D).

Next, the gate electrode precursor layer 907A is etched back in such a manner that the gate electrode precursor layer 907A remains on the sidewalls of the first silicon pillar 901*a* and the second silicon pillar 901*b*. As a result, a gate electrode 907 is formed along the sidewalls of the first silicon pillar 901*a* and the second silicon pillar 901*b* (FIG. 10E). Depending on the distance between the first silicon pillar 901*a* and the second silicon pillar 901*b*, the gate electrode 907 can be formed as an electrically conducting gate electrode covering the sidewalls of the first silicon pillar 901*a* and the second silicon pillar 901*b*. At this time, the gate electrode precursor layer 907A remains on a sidewall of the STI insulating film 902, however, this does not affect the operation of the transistor. Further, the gate electrode precursor layer 907A remaining on the sidewall of the STI insulating film 902 may remain floating or may be connected to a ground potential.

Next, a first interlayer insulating film 908 is formed using a silicon oxide film, and the upper surface of the first interlayer insulating film 908 is planarized by CMP (Chemical Mechanical Polishing) method (FIG. 11A).

Next, a third mask 909 is formed on the first interlayer insulating film 908 using a silicon oxide film. Next, a first opening 909*a* is formed in the third mask 909 above the first silicon pillar 901*a*. Then, through the first opening 909*a*, the second mask 904 above the first silicon pillar 901*a* is removed by wet etching. As a result, a second opening 908*a* is formed in the first interlayer insulating film 908 (FIG. 11B). At this time, the second mask 904 above the second silicon pillar 901*b* is masked by the third mask 909 so that the second mask 904 is not removed.

Next, a sidewall that will become a fourth mask 910 is formed on the inner wall of the second opening 908*a*. For instance, the fourth mask 910 can be formed by forming a silicon nitride film and etching it back. Next, the upper surface (the silicon surface) of the first silicon pillar 901*a* is exposed by etching the first mask 903 on the top of the first silicon pillar 901*a* using the fourth mask 910 as a mask (FIG. 11C).

Next, a semiconductor layer 911 is formed by filling the second opening 908*a* using a selective epitaxial growth method. Then, an upper diffusion layer 912 is formed by injecting an impurity of the second conductivity type such as arsenic into an upper part of the first silicon pillar 901*a* by the ion implantation technique (FIG. 11D). The upper diffusion layer 912 functions as the other electrode of the source or drain electrode, i.e., as the counter electrode to the lower diffusion layer 905.

Next, a second interlayer insulating film 913 is formed on the first interlayer insulating film 908 using a silicon oxide film, and the upper surface thereof is planarized by CMP. The second interlayer insulating film 913 may be formed after removing the third mask 909 by etching. Next, first to third contact plugs 914 to 916 electrically connected to the lower diffusion layer 905, the upper diffusion layer 912, and the gate electrode 907 are formed. The third contact plug 916 is electrically connected to the gate electrode 907 by being disposed on the side of the second silicon pillar 901*b* not facing the side of the first silicon pillar 901*a*. In a miniaturized vertical MOS transistor, it is difficult to dispose both the second contact plug 915 and the third contact plug 916 above the first silicon pillar 901*a* in such a manner that they are not short-circuited. Therefore, by utilizing the side of the second silicon pillar 901*b* and stretching the gate electrode 907 to a position away from the side of the first silicon pillar 901*a*, it becomes possible to dispose the third contact plug 916 at a position where it does not short-circuit with the second contact plug 915.

By the process-steps described above, a semiconductor device 900 having a vertical MOS transistor Qn9 can be manufactured.

Here, problems caused by this manufacturing method will be described using the semiconductor device 900 having the vertical MOS transistor Qn9.

As shown in FIG. 10E, the gate electrode 907 is formed by an etch-back process. As a result, the position of the upper end of the gate electrode 907 is likely to be not uniform. Meanwhile, since the upper diffusion layer 912 is formed by injecting an impurity over the first silicon pillar 901*a*, the position thereof is not influenced by the nonuniformity in the upper end position of the gate electrode 907. In other words, the upper diffusion layer 912 is formed above the silicon pillar independently of the position of the upper end of the gate electrode 907. As a result, the relative position between the bottom (the lower end) of the upper diffusion layer 912 and the upper end of the gate electrode 907 tends to be not uniform. Therefore, the state caused by the electric field of the gate electrode 907 changes, and fluctuation in the breakdown voltage between the upper diffusion layer 912 and the semiconductor substrate 901 is likely to occur.

Additionally to this, if the gate insulating film 906 is damaged when the first mask 903 on the first silicon pillar 901*a* is etched, or if the semiconductor layer 911 grows abnormally when the semiconductor layer 911 is subjected to the selective epitaxial growth process, the breakdown voltage will be likely to decrease, too.

When the breakdown voltage varies, i.e. suffer fluctuation an ESD protection device cannot be expected to function stably. Further, when the breakdown voltage decreases, the ESD protection device cannot prevent elements to be protected from being damaged or may get destroyed because the device cannot sufficiently discharge surge voltage.

FIG. 13 shows a schematic cross section of the semiconductor device in which the vertical MOS transistor Qn9 manufactured by the manufacturing method shown in FIGS. 10A-11E is connected to a pad and a ground potential wiring thereof. FIG. 13 is a cross section taken along a XIII-XIII line in the schematic plan shown in FIG. 12. In the semiconductor device 900, the lower diffusion layer 905 is electrically connected to a ground potential wiring 921 via the first contact plug 914. The upper diffusion layer 912 is electrically connected to a pad 920 for bonding via the semiconductor layer 911 and the second contact plug 915. The gate electrode 907 is electrically connected to the ground potential wiring 921 via the third contact plug 916.

In the semiconductor device 900, when a surge voltage (static stress) is applied to the pad 920, a breakdown occurs between the upper diffusion layer 912 and the semiconductor substrate 901. At this time, if the relative distance between the upper end of the gate electrode 907 and the bottom end of the upper diffusion layer 912 is not constant, the breakdown voltage varies. As a result, the clamping characteristics become unstable and the device cannot sufficiently discharge the static stress applied from an external source. Thus there is much to be desired in the art.

According to a first aspect of the present invention, there is provided a semiconductor device, comprising a vertical MOS transistor including an upper diffusion layer and a lower diffusion layer which is located lower than the upper diffusion layer, as source and drain electrodes. A breakdown occurs between the lower diffusion layer and a semiconductor substrate in which the lower diffusion layer is formed when a surge voltage is applied.

According to a second aspect, there is provided a semiconductor device, comprising a semiconductor substrate; a vertical MOS transistor including a gate electrode formed on the semiconductor substrate, an upper diffusion layer formed on the semiconductor substrate on an upper end side of the gate electrode as one of source and drain electrodes, and a lower diffusion layer formed in the semiconductor substrate on a lower end side of the gate electrode as the other of the source and drain electrodes; and a pad electrically connected to the lower diffusion layer.

According to a third aspect, there is provided a semiconductor device, comprising a vertical MOS transistor including a semiconductor substrate having a silicon pillar, a gate electrode formed along a sidewall of the silicon pillar, a gate insulating film formed between the gate electrode and the silicon pillar, an upper diffusion layer formed on the top of the silicon pillar as one of source and drain electrodes, and a lower diffusion layer formed lower than the upper diffusion layer in the semiconductor substrate as the other of the source and drain, electrodes; and a pad electrically connected to the lower diffusion layer. A breakdown occurs between the lower diffusion layer and the semiconductor substrate and a surge voltage is discharged when the surge voltage is applied.

The meritorious effects of the present invention are summarized as follows. The present invention has at least one of the following effects.

In the present invention, surge voltage is caused to be applied to a lower diffusion layer having a uniform relative positional relation with a gate electrode. As a result, according to the present invention, the breakdown voltage can be stabilized and the function of an ESD protection device can be stabilized.

Further, according to the present invention, a decrease in a breakdown (i.e. withstanding) voltage of an ESD protection device can be suppressed, and the ESD protection device can be prevented from being damaged by a surge voltage.

PREFERRED MODES

Figure 1:
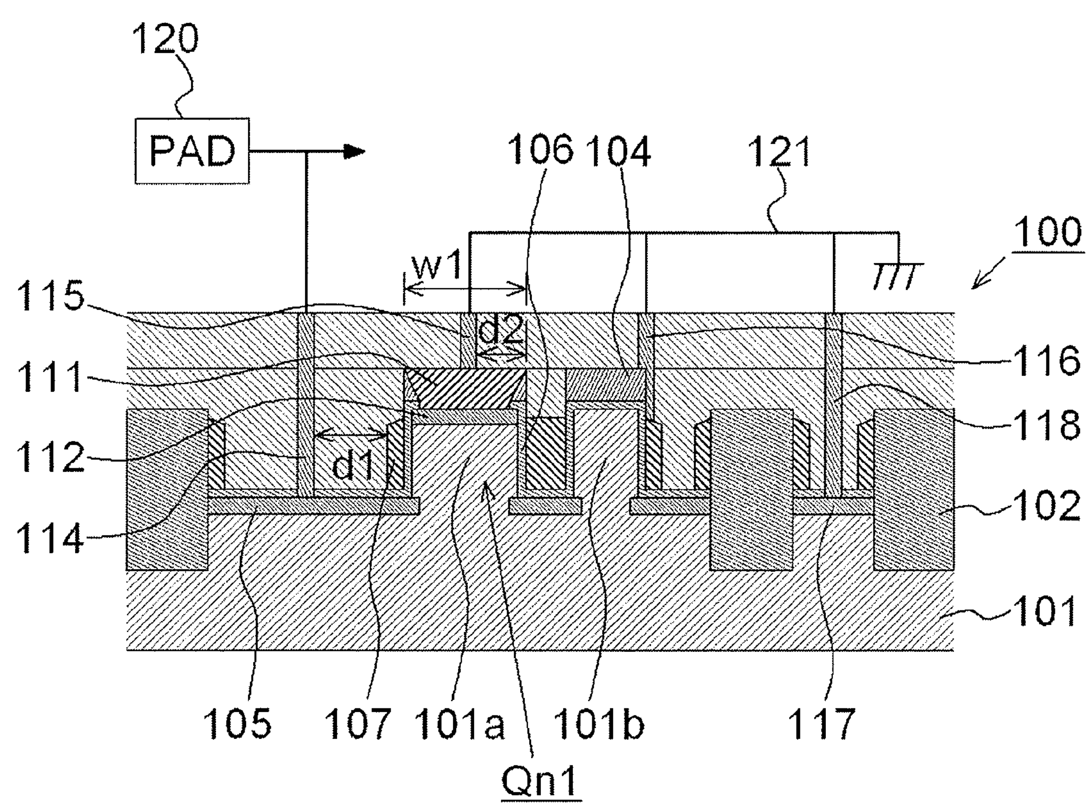
FIG. 1 is a schematic cross section of a semiconductor device according to a first exemplary embodiment of the present invention.

Preferred modes of the first to the third aspects will be described below.

According to the preferred modes of the first to the third aspects, the semiconductor device further comprises an external terminal that receives/outputs a signal from/to an external source. The external terminal and the pad are electrically connected to each other.

According to the preferred modes of the first to the third aspects, the position of the upper end of the gate electrode is determined independently of the position of a bottom surface of the upper diffusion layer.

According to the preferred modes of the first to the third aspects, the semiconductor device further comprises a wiring of a fixed potential electrically connected to the upper diffusion layer.

According to the preferred modes of the first to the third aspects, as the vertical MOS transistor includes, the semiconductor device comprises vertical MOS transistors of the first and second conductivity types, i.e. a p-channel vertical MOS transistor and a n-channel vertical MOS transistor. The upper diffusion layer of the n-channel vertical MOS transistor may be electrically connected to a ground potential wiring. The upper diffusion layer of the p-channel vertical MOS transistor may be electrically connected to a power supply potential wiring.

According to the preferred modes of the first to the third aspects, the vertical MOS transistors of the first and second conductivity types, i.e. the p-channel vertical MOS transistor and the n-channel vertical MOS transistor, respond to a signal supplied to each gate electrode, operate as output transistors, and output via the pad.

According to the preferred modes of the first to the third aspects, the vertical MOS transistor operates as an electrostatic discharge protection device and protects the semiconductor device by discharging the surge voltage through the breakdown.

According to the preferred modes of the first to the third aspects, the semiconductor device may further comprise an electrostatic discharge protection device. The vertical MOS transistor may be a trigger transistor that serves to start an operation of the electrostatic discharge protection device.

According to the preferred modes of the first to the third aspects, the semiconductor device may further comprise an element isolation region in the semiconductor substrate. The electrostatic discharge protection device may comprise a bipolar transistor. At least one of diffusion layers of the bipolar transistor is disposed horizontally adjacent to the lower diffusion layer of the vertical MOS transistor via the element isolation region.

According to the preferred modes of the first to the third aspects, the semiconductor device may further comprise a transistor to be protected by a vertical MOS transistor which operates as an electrostatic discharge protection device. The vertical MOS transistor is disposed between the pad and the transistor to be protected.

According to the preferred modes of the first to the third aspects, the semiconductor substrate may be connected to a fixed potential.

Figure 2:
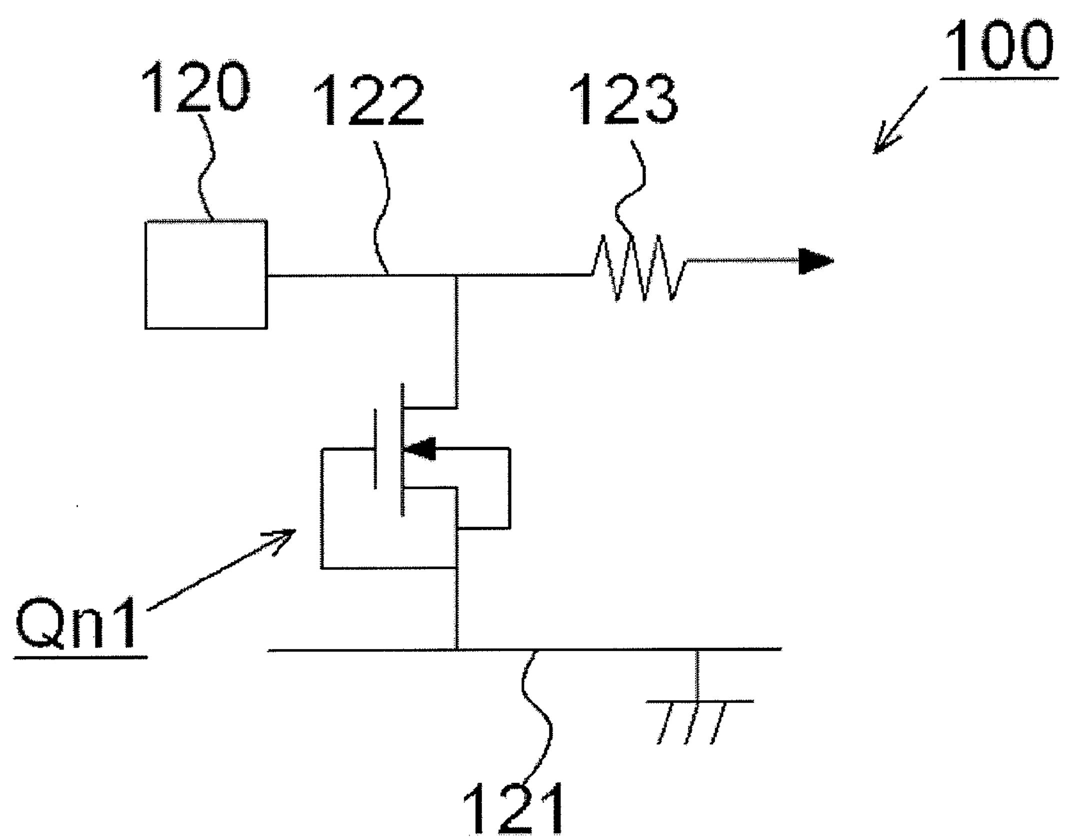
FIG. 2 is a circuit diagram showing an example of a semiconductor device shown in FIG. 1.

A semiconductor device according to a first exemplary embodiment will be described. FIG. 1 shows a schematic cross section of the semiconductor device according to the first exemplary embodiment of the present invention. FIG. 2 shows an example of a circuit diagram of a semiconductor device 100 shown in FIG. 1.

The semiconductor device 100 comprises a semiconductor substrate 101 of a first conductivity type having a first silicon pillar 101_a_ and a second silicon pillar 101_b_, an STI insulating film 102, and a vertical MOS transistor Qn1 formed on the semiconductor substrate 101 as an ESD protection device. In the circuit diagram shown in FIG. 2, the vertical MOS transistor Qn1 is an n-type transistor. The vertical MOS transistor Qn1 is connected between a signal wiring 122 connected to a pad 120 and a ground potential wiring 121. The signal wiring 122 is connected to an internal circuit (not shown in the drawing) via a protective resistor 123 (not shown in FIG. 1).

The vertical MOS transistor Qn1 comprises a gate electrode 107 formed around sidewalls of the first silicon pillar 101_a_ and the second silicon pillar 101_b_; a gate insulating film 106 formed between the first silicon pillar 101_a_ and the second silicon pillar 101_b_, and the gate electrode 107; an upper diffusion layer 112 of a second conductivity type formed on the top of the first silicon pillar 101_a_; and a lower diffusion layer 105 of the second conductivity type formed around a lower part of the first silicon pillar 101*a*. The upper diffusion layer 112 and the lower diffusion layer 105 function as a source electrode and a drain electrode. The upper end of the gate electrode 107 has been subjected to an etching process (etching back process), and the gate electrode(s) 107 is (are) formed in such a manner that it (they) remains (remain) along the sidewalls of the first and the second silicon pillars 101*a* and 101*b*.

The semiconductor device 100 further comprises a first contact plug 114 electrically connected to the lower diffusion layer 105; a second contact plug 115 electrically connected to the upper diffusion layer 112 via a semiconductor layer 111; a third contact plug 116 electrically connected to the gate electrode 107 on the sidewall of the second silicon pillar 101*b*; the pad 120 electrically connected to the first contact plug 114; and the ground potential wiring 121 electrically connected to the second contact plug 115 and the third contact plug 116. In other words, the lower diffusion layer 105 of the vertical MOS transistor is electrically connected to the pad 120. The upper diffusion layer 112 and the gate electrode 107 are electrically connected to the ground potential wiring 121. As a result, the vertical MOS transistor Qn1 functions as a clamping device. By forming the third contact plug 116 on a side of the second silicon pillar 101*b* not facing a side of the first silicon pillar 101*a*, a short circuit between the third contact plug and the second contact plug can be prevented. Further, the pad 120 is an electrical conductor (bonding pad) used for wire bonding for electrically connecting an external terminal provided for feeding/outputting a signal to/from the semiconductor device 100 and a circuit element inside the semiconductor device. The pad may include also a conductor disposed for connecting to the external terminal via a through-hole electrode or the like without wire bonding.

It is preferred that the semiconductor device 100 further comprises a substrate diffusion layer 117 of the first conductivity type that fixes the potential of the semiconductor substrate 101, and a fourth contact plug 118 that electrically connects the substrate diffusion layer 117 and the ground potential wiring 121. For instance, the substrate diffusion layer 117 is formed on the semiconductor substrate 101 as a p-type diffusion layer, and a periphery thereof is compartmentalized by the STI insulating film 102. As a result, the substrate potential of the vertical MOS transistor Qn1 can be fixed to the ground potential.

A surge voltage (static stress) externally applied to the semiconductor device 100 via the pad 120 is discharged to the ground potential wiring 121 via the vertical MOS transistor Qn1. As a result, the internal circuit to which the signal wiring 122 is connected is protected from the application of the static stress.

At this time, a breakdown occurs between the lower diffusion layer 105 and the semiconductor substrate 101. In other words, in the vertical MOS transistor Qn1, surge voltage is discharged via the lower diffusion layer 105 having a more stable relative positional relation with the gate electrode 107 than the upper diffusion layer 112. As a result, the breakdown voltage can be stabilized, and therefore the function as an ESD protection device can be stabilized. Further, since a decrease in the breakdown voltage of the ESD protection device can be avoided by discharging surge voltage via the lower diffusion layer 105, the ESD protection device can be prevented from being destroyed by the application of a surge voltage.

It is preferred to enlarge the planar dimensions w1 (for instance the width) of the first silicon pillar 101*a*, which is the main body of the transistor, in order to increase the discharge capacity of the vertical MOS transistor Qn1. Further, the gate electrode 107 is prevented from being damaged by a discharge current by making an interval d1 between the first contact plug 114 and the gate electrode 107 and an interval d2 between the second contact plug 115 and the gate electrode 107 on a plane projection greater than an interval between a contact plug and a gate electrode disposed in a MOS transistor constituting the internal circuit. The reason is that, when the intervals d1 and d2 are sufficiently large, the discharge current is dispersed by the time it reaches the gate electrode and the current is prevented from concentrating on a particular part of the gate electrode. Therefore, the greater the intervals d1 and d2 are, the more conspicuous this effect becomes. However, also a problem is brought about that the footprint (area occupied by) of the ESD protection device increases. Therefore, it is preferred to set and optimize the size of the first silicon pillar 101*a* and the intervals d1 and d2 according to assumed electrostatic discharge voltage and current.

For instance, the semiconductor device 100 can be manufactured utilizing the vertical MOS transistor manufacturing method described using FIGS. 10A-11E. For instance, the substrate diffusion layer 117 can be formed by ion-implanting a p-type impurity such as boron (B) after patterns divided by the STI insulating film 102 are formed at the same time as the lower diffusion layer 105.

FIG. 2 shows an example in which an n-channel MOS transistor is used as an ESD protection device, however, a p-channel MOS transistor can be used as an ESD protection device as well. In a case where the vertical MOS transistor Qn1 is p-channel type, the lower diffusion layer 105 is connected to the pad 120 as in the exemplary embodiment shown in FIG. 1, however, the upper diffusion layer 112 is connected to a fixed potential wiring such as a power supply potential wiring (VDD). In a case where a p-type substrate is used as the semiconductor substrate 101, an n-type well is formed and a p-channel MOS transistor is disposed in this n-type well region.

Figure 3:
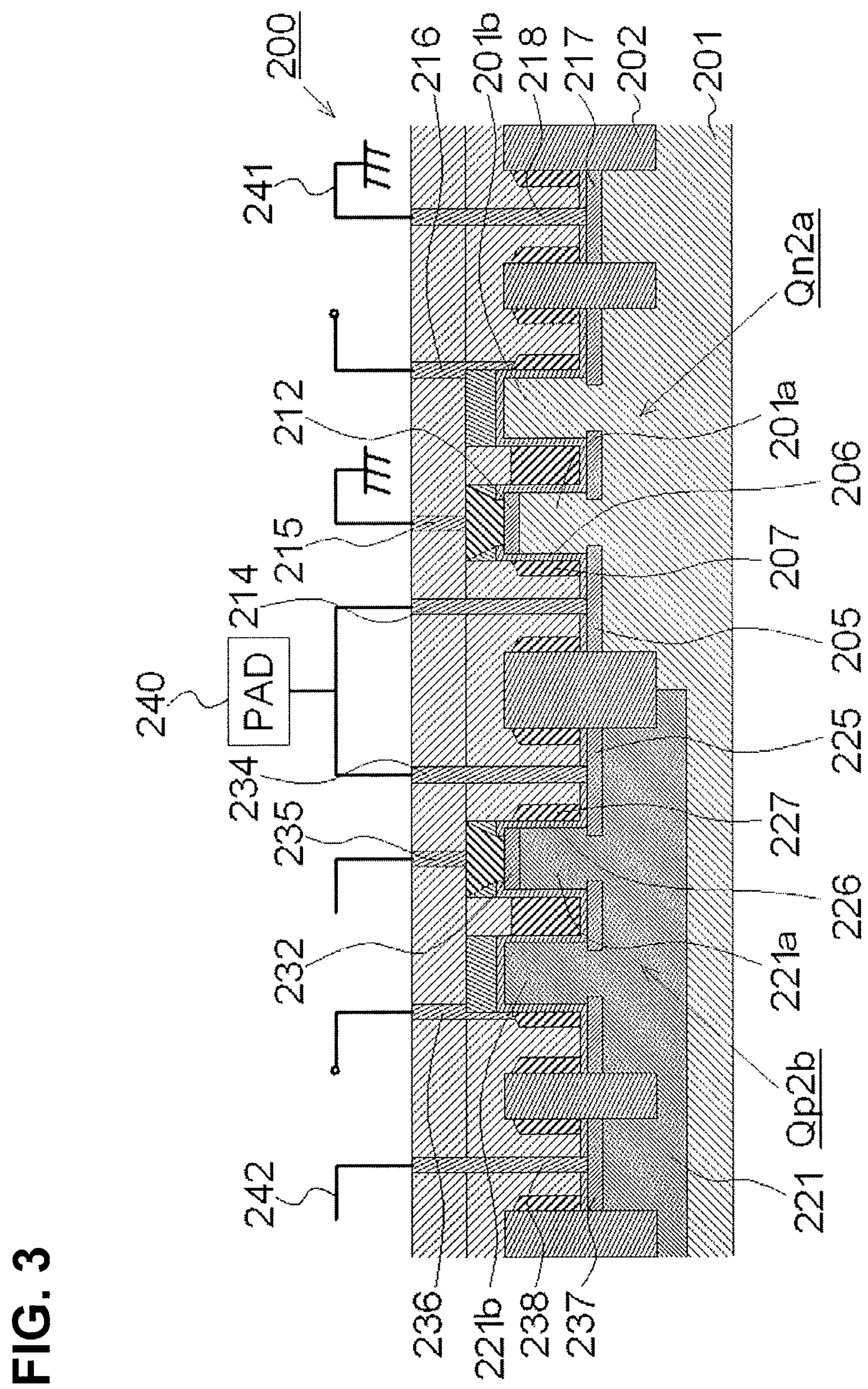
FIG. 3 is a schematic cross section of a semiconductor device according to a second exemplary embodiment of the present invention.
Figure 4:
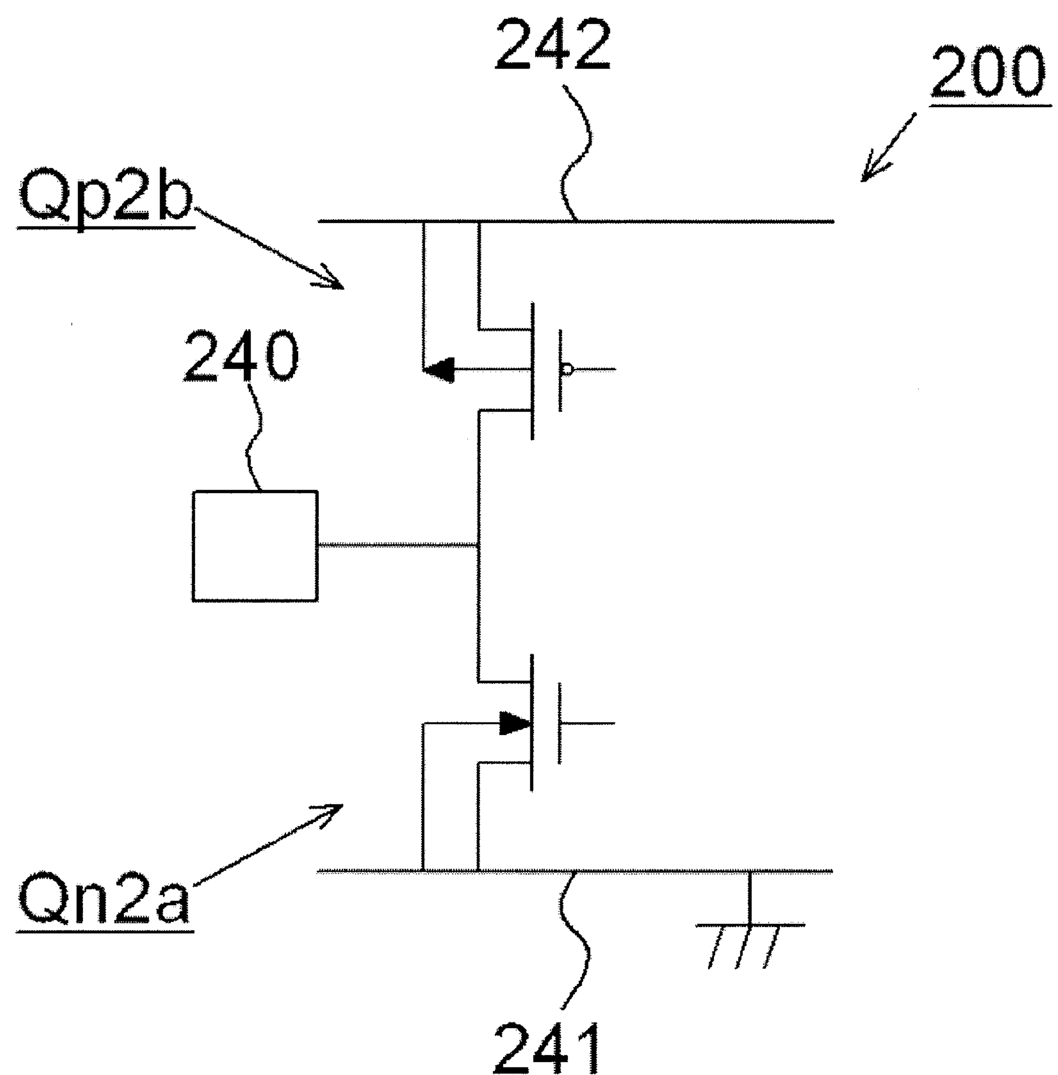
FIG. 4 is a circuit diagram showing an example of a semiconductor device shown in FIG. 3.

Next, a semiconductor device according to a second exemplary embodiment of the present invention will be described. FIG. 3 shows a schematic cross section of the semiconductor device according to the second exemplary embodiment of the present invention. FIG. 4 shows an example of a circuit diagram of a semiconductor device 200 shown in FIG. 3. The semiconductor device 200 comprises an output transistor. In the second exemplary embodiment, this output transistor functions as an ESD protection device as well.

The semiconductor device 200 comprises a semiconductor substrate 201 of a first conductivity type; a well 221 of a second conductivity type formed on the semiconductor substrate 201; a first vertical MOS transistor Qn2*a* of the second conductivity type (n-channel type in FIG. 4) formed on the semiconductor substrate 201; a second vertical MOS transistor Qp2*b* of the first conductivity type (p-channel type in FIG. 4) formed in the well 221; a pad 240 electrically connected to the first vertical MOS transistor Qn2*a* and the second vertical MOS transistor Qp2*b*; a ground potential wiring 241 electrically connected to the first vertical MOS transistor Qn2*a*; and a power supply potential wiring 242 electrically connected to the second vertical MOS transistor Qp2*b*. The well 221 can be formed by injecting an impurity such as phosphorus in a case of the n-type or boron in a case of the p-type into the semiconductor substrate 201 using the ion implantation technique.

The structure of and the manufacturing method for the first vertical MOS transistor Qn2*a* and the second vertical MOS transistor Qp2*b* are the same as those of the vertical MOS transistor in the first exemplary embodiment, except for the conductivity types.

The first vertical MOS transistor Qn2*a* comprises a first silicon pillar 201*a*; a second silicon pillar 201*b*; a first lower diffusion layer 205 of the second conductivity type; a first upper diffusion layer 212 of the second conductivity type; a first gate electrode 207; and a first gate insulating film 206. The first lower diffusion layer 205 is electrically connected to the pad 240 via a first contact plug 214. The first upper diffusion layer 212 is electrically connected to the ground potential wiring 241 via a second contact plug 215. The first gate electrode 207 is electrically connected to an internal circuit (not shown in the drawings) via a third contact plug 216. A signal that drives the first vertical MOS transistor Qn2*a* is fed to the gate electrode 207. The first vertical MOS transistor Qn2*a* functions as an output transistor.

The second vertical MOS transistor Qp2*b* comprises a first silicon pillar 221*a*; a second silicon pillar 221*b*; a second lower diffusion layer 225 of the first conductivity type; a second upper diffusion layer 232 of the first conductivity type; a second gate electrode 227; and a second gate insulating film 226. The second lower diffusion layer 225 is electrically connected to the pad 240 via a fifth contact plug 234. The second upper diffusion layer 232 is electrically connected to the power supply potential wiring 242 via a sixth contact plug 235. The second gate electrode 227 is electrically connected to the internal circuit (not shown in the drawings) via a seventh contact plug 236. A signal that drives the second vertical MOS transistor Qp2*b* is fed to the gate electrode 227. The second vertical MOS transistor Qp2*b* functions as an output transistor.

Further, the semiconductor device 200 has a first substrate diffusion layer 217 of the first conductivity type that fixes the potential of the semiconductor substrate 201 as in the first exemplary embodiment. The first substrate diffusion layer 217 is electrically connected to the ground potential wiring 241 via a fourth contact plug 218. As a result, the potential of a channel part of the first vertical MOS transistor Qn2*a* can be fixed.

Further, the semiconductor device 200 has a second substrate diffusion layer 237 of the second conductivity type that fixes the potential of the well 221. The second substrate diffusion layer 227 is electrically connected to the power supply potential wiring 242 via an eight contact plug 238. As a result, the potential of the well 221 can be fixed.

In the semiconductor device 200, the pad 240 is electrically connected to the first lower diffusion layer 205 of the first vertical MOS transistor Qn2*a* and the second lower diffusion layer 225 of the second vertical MOS transistor Qp2*b*. Because of this, when static electricity is discharged, a breakdown occurs between the lower diffusion layers 205 and 225 and the semiconductor substrates 201 and 221. Depending on the breakdown operation, each of the first and the second vertical MOS transistors Qn2*a* and Qp2*b* functions as an ESD protection device, and variation in the breakdown voltage can be suppressed in any transistor. According to the second exemplary embodiment, the function of an ESD protection device can be stabilized in a structure in which an output transistor is constituted by a vertical MOS transistor.

Figure 5:
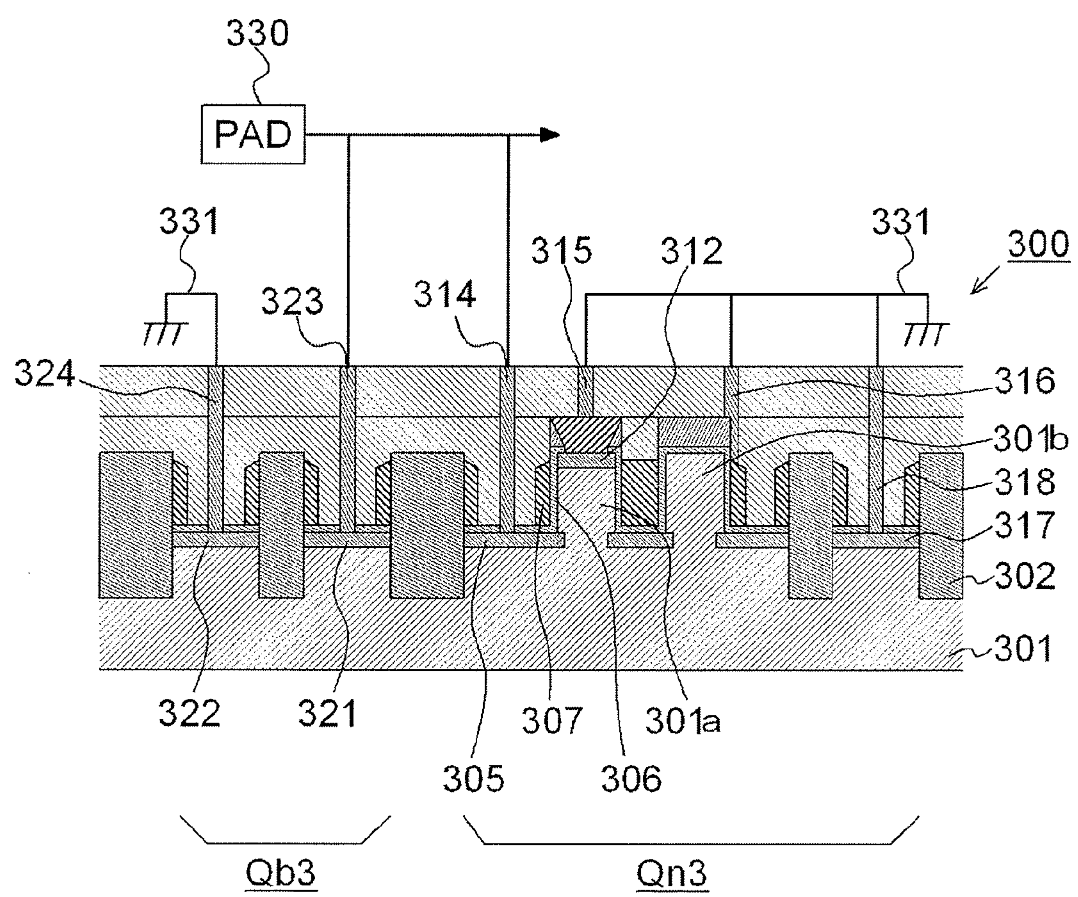
FIG. 5 is a schematic cross section of a semiconductor device according to a third exemplary embodiment of the present invention.
Figure 6:
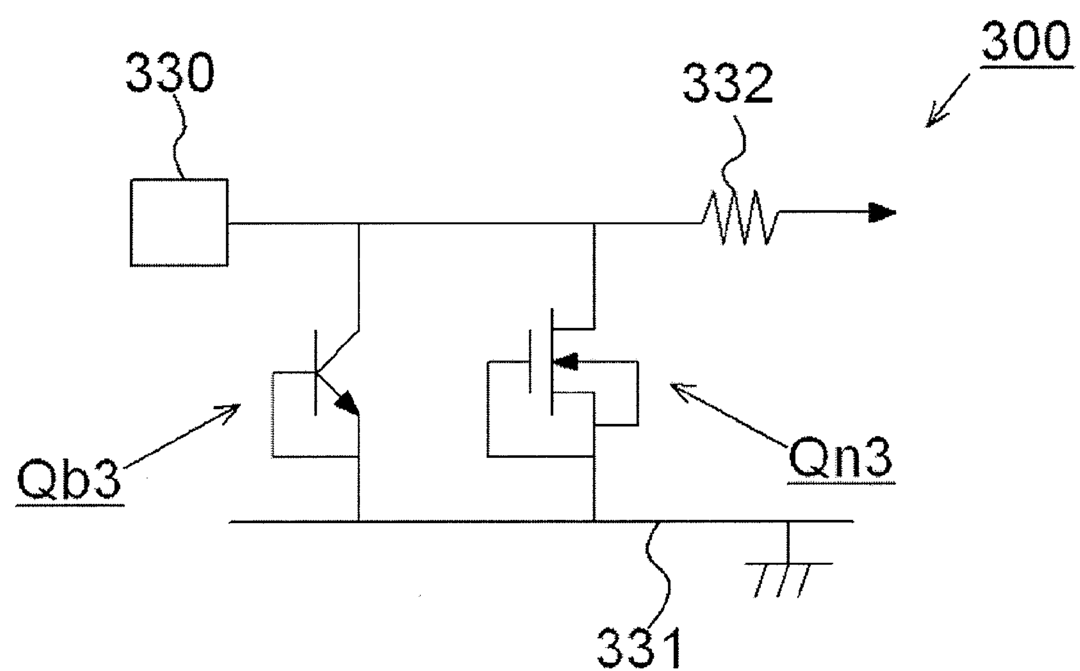
FIG. 6 is a circuit diagram showing an example of a semiconductor device shown in FIG. 5.

Next, a semiconductor device according to a third exemplary embodiment of the present invention will be described. FIG. 5 shows a schematic cross section of the semiconductor device according to the third exemplary embodiment of the present invention. FIG. 6 shows an example of a circuit diagram of a semiconductor device 300 shown in FIG. 5. The semiconductor device 300 comprises a vertical MOS transistor Qn3 of a second conductivity type (n-channel type in FIG. 6), and a bipolar transistor Qb3 formed adjacent to the vertical MOS transistor Qn3. In the third exemplary embodiment, the vertical MOS transistor Qn3 and the bipolar transistor Qb3 function as an ESD protection device. The vertical MOS transistor Qn3 also functions as a trigger transistor that lowers the operation start voltage of the bipolar transistor Qb3.

The vertical MOS transistor Qn3 comprises a first silicon pillar 301*a*; a second silicon pillar 301*b*; a first lower diffusion layer 305 of the second conductivity type; an upper diffusion layer 312 of the second conductivity type; a gate electrode 307; and a gate insulating film 306. The first lower diffusion layer 305 is electrically connected to a pad 330 via a first contact plug 314. The upper diffusion layer 312 is electrically connected to a ground potential wiring 331 via a second contact plug 315. The gate electrode 307 is electrically connected to the ground potential wiring 331 via a third contact plug 316. A signal that drives the first vertical MOS transistor Qn2*a* is fed to the gate electrode 307.

Further, the semiconductor device 300 has a substrate diffusion layer 317 of the first conductivity type that fixes the potential of a semiconductor substrate 301 as in the first exemplary embodiment. The substrate diffusion layer 317 is electrically connected to the ground potential wiring 331 via a fourth contact plug 318. As a result, the potential of a channel part of the vertical MOS transistor Qn3 can be fixed.

The structure of and the manufacturing method for the vertical MOS transistor Qn3 are the same as those of the vertical MOS transistor in the first exemplary embodiment.

For instance, in a case where a p-type substrate is used as the semiconductor substrate 301, the bipolar transistor Qb3 is an npn bipolar transistor having an n-type first diffusion layer 321 and an n-type second diffusion layer 322 formed in the same layer (at the same level) as the lower diffusion layer 305 of the vertical MOS transistor Qn3. Each of the first diffusion layer 321 and the second diffusion layer 322 is compartmentalized by an STI insulating film 302. The first diffusion layer 321 is adjacent to the lower diffusion layer 305 of the vertical MOS transistor Qn3 with the STI insulating film 302 interposed therebetween. The first diffusion layer 321 is electrically connected to the pad 330 via a fifth contact plug 323. The second diffusion layer 322 is electrically connected to the ground potential wiring 331 via a sixth contact plug 324. For instance, the first substrate diffusion layer 321 and the second diffusion layer 322 can be formed by ion-implanting an n-type impurity such as arsenic (As) into the semiconductor substrate 301 after patterns divided by the STI insulating film 302 are formed at the same time as the lower diffusion layer 305.

When a surge voltage is applied to the pad 330 in the semiconductor device 300, first a breakdown occurs in the lower diffusion layer 305 having a low breakdown voltage. As a result, a current flows through the semiconductor substrate 301. This current increases a substrate potential around the lower diffusion layer 305. Because of the increase in the substrate potential, a current starts to flow from the first diffusion layer 321 of the bipolar transistor Qb3 to the semiconductor substrate 301, starting the operation of the bipolar transistor Qb3.

The first diffusion layer 321 can be efficiently influenced by the increase in the substrate potential caused by the vertical MOS transistor Qn3 by forming the first diffusion layer 321 horizontally adjacent to the lower diffusion layer 305 through the STI insulating film 302 and closer to (preferably in the same layer as) the lower diffusion layer 305 than the upper diffusion layer 312.

By making the vertical MOS transistor Qn3 as a trigger transistor, the operation start voltage of the bipolar transistor Qb3 can be decreased. As a result, even when a gate insulating film in a MOS transistor in an internal circuit to be protected is thin, a breakdown voltage can be lowered than a withstanding voltage.

In the present exemplary embodiment, a breakdown that serves as a trigger is also made in the lower diffusion layer of the vertical MOS transistor. As a result, the ESD protection function can be stabilized. Further, the breakdown voltage can be stabilized.

Figure 7:
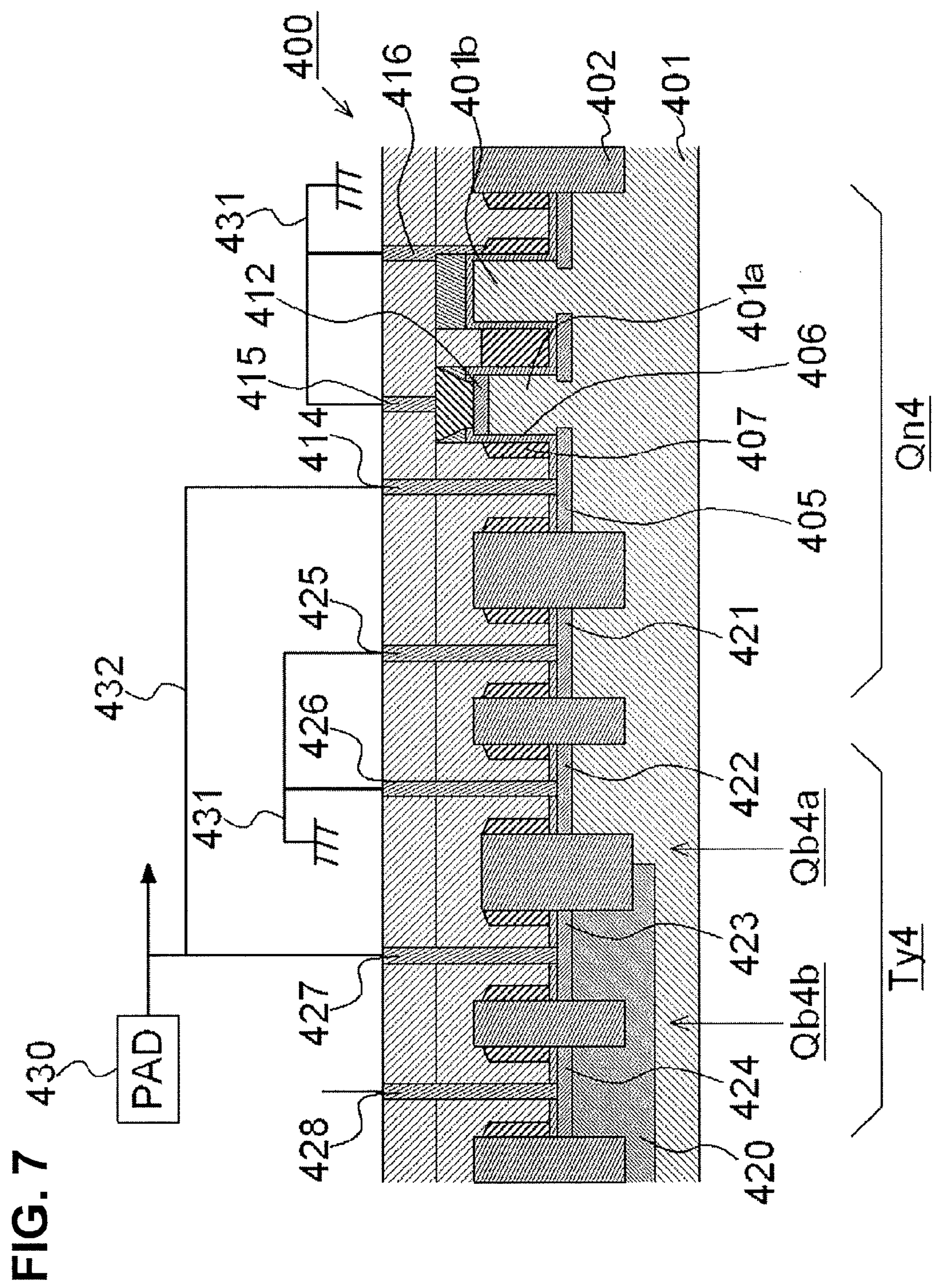
FIG. 7 is a schematic cross section of a semiconductor device according to a fourth exemplary embodiment of the present invention.
Figure 8:
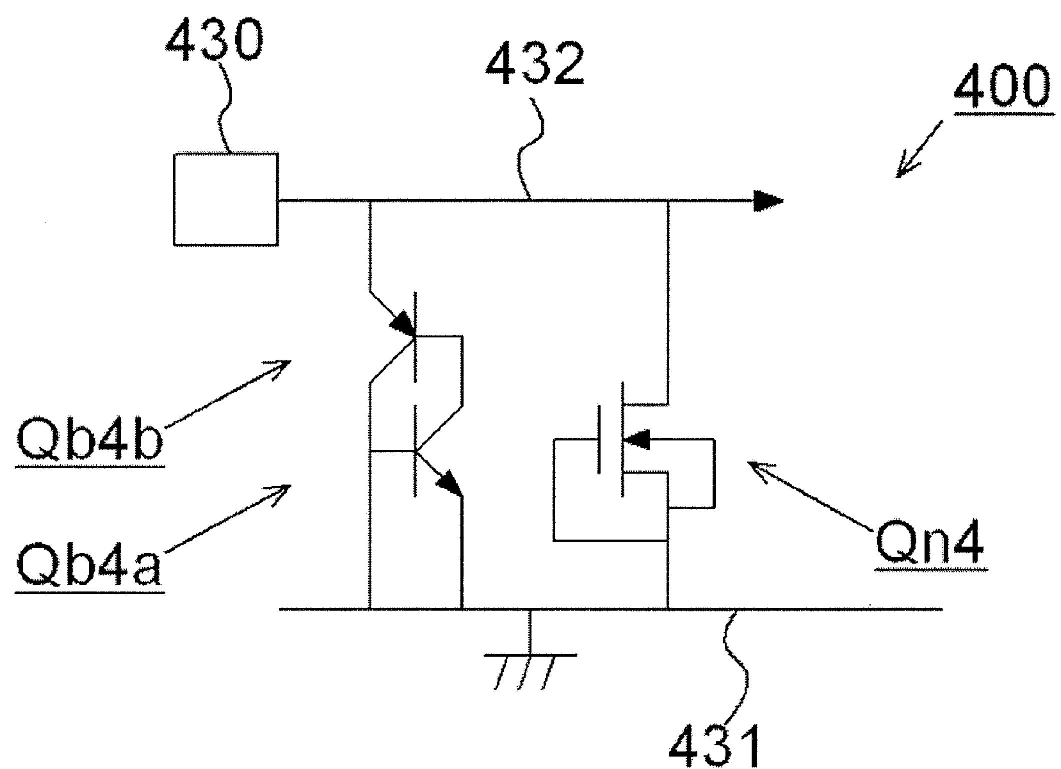
FIG. 8 is a circuit diagram showing an example of the semiconductor device shown in FIG. 7.

Next, a semiconductor device according to a fourth exemplary embodiment of the present invention will be described. FIG. 7 shows a schematic cross section of the semiconductor device according to the fourth exemplary embodiment of the present invention. FIG. 8 shows an example of a circuit diagram of a semiconductor device 400 shown in FIG. 7. The semiconductor device 400 comprises a vertical MOS transistor Qn4 (n-channel type in FIG. 8), and a thyristor Ty4 having a first bipolar transistor Qb4*a* and a second bipolar transistor Qb4*b*. The vertical MOS transistor Qn4 and the thyristor Ty4 are disposed adjacent to each other. In the fourth exemplary embodiment, the vertical MOS transistor Qn4 and the thyristor Ty4 function as an ESD protection device. The vertical MOS transistor Qn4 also functions as a trigger transistor lowering the operation start voltage of the thyristor as in the third exemplary embodiment. In the circuit diagram shown in FIG. 8, the thyristor having a pnpn structure is connected to a pad that supplies power.

The vertical MOS transistor Qn4 comprises a first silicon pillar 401*a*; a second silicon pillar 401*b*; a lower diffusion layer 405 of a second conductivity type; an upper diffusion layer 412 of the second conductivity type; a gate electrode 407; and a gate insulating film 406. The lower diffusion layer 405 is electrically connected to a pad 430 via a first contact plug 414. The upper diffusion layer 412 is electrically connected to a ground potential wiring 431 via a second contact plug 415. The gate electrode 407 is electrically connected to the ground potential wiring 431 via a third contact plug 416.

Further, the semiconductor device 400 has a first substrate diffusion layer 421 of a first conductivity type that fixes the potential of a semiconductor substrate 401 as in the first exemplary embodiment. The first substrate diffusion layer 421 is electrically connected to the ground potential wiring 431 via a fourth contact plug 425. As a result, the potential of a channel part of the vertical MOS transistor Qn4 can be fixed.

The structure of and the manufacturing method for the vertical MOS transistor Qn4 are the same as those of the vertical MOS transistor in the first exemplary embodiment.

The npn-type first bipolar transistor Qb4*a* is constituted by an n-type first diffusion layer 422, the p-type semiconductor substrate 401, and an n-type well 420. The pnp-type second bipolar transistor Qb4*b* is constituted by the p-type semiconductor substrate 401, the n-type well 420, and a p-type second diffusion layer 423. The first diffusion layer 422 is electrically connected to the ground potential wiring 431 via a fifth contact plug 426. The second diffusion layer 423 is electrically connected to the pad 430 via a sixth contact plug 427.

In the semiconductor substrate 401, the first diffusion layer 422 and the second diffusion layer 423 are formed in the same layer (at the same level) as the lower diffusion layer 405 of the vertical MOS transistor Qn4.

Further, the semiconductor device 400 comprises a second substrate diffusion layer 424 of the second conductivity type that fixes the potential of the well 420. The second substrate diffusion layer 424 is electrically connected to a predetermined potential via a seventh contact plug 428. As a result, the potential of the well 420 can be fixed.

The operation of the vertical MOS transistor Qn4 is the same as the third exemplary embodiment. In other words, when a surge voltage is applied to the pad 430, first a breakdown occurs in the lower diffusion layer 405. As a result, a substrate potential increases, starting the clamping operation of the thyristor Ty4.

In the present exemplary embodiment, a breakdown that serves as a trigger is also made in the lower diffusion layer of the vertical MOS transistor. As a result, the ESD protection function can be stabilized. Further, the breakdown voltage can be stabilized.

Figure 9:
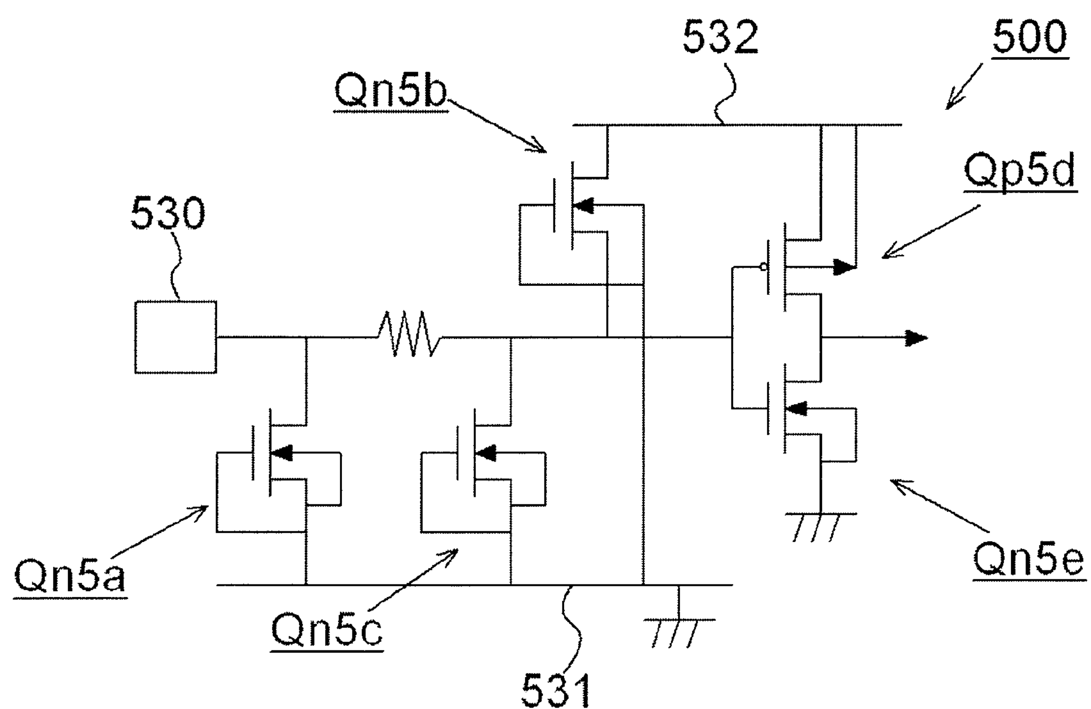
FIG. 9 is a schematic cross section showing an example of a semiconductor device according to a fifth exemplary embodiment of the present invention.
Figure 10A:
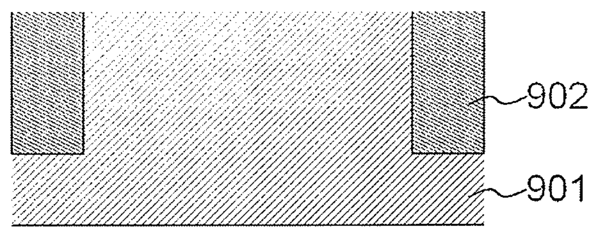
FIGS. 10A, 10B, 10C, 10D, and 10E are schematic process diagrams for explaining a method of manufacturing a vertical MOS transistor.
Figure 10B:
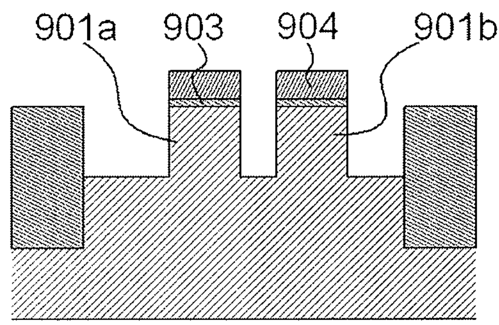
Figure 10C:
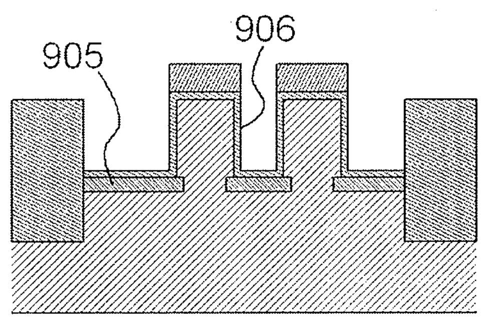
Figure 10D:
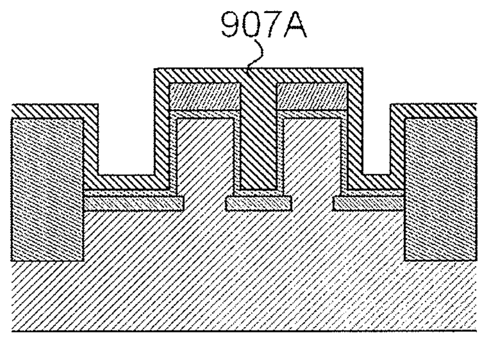
Figure 10E:
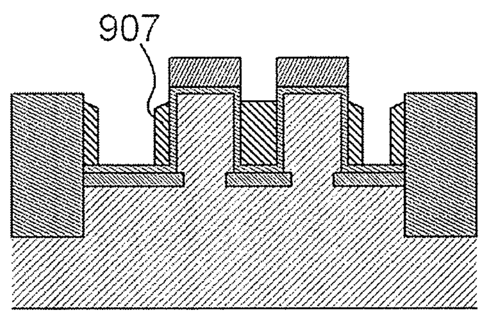
Figure 11A:
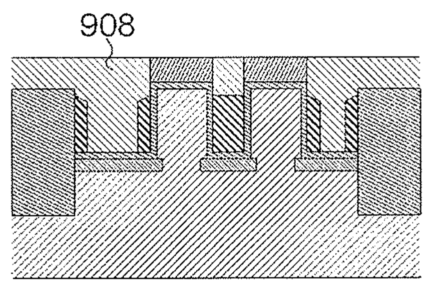
FIGS. 11A, 11B, 11C, 11D, and 11E are schematic process diagrams for explaining a method of manufacturing a vertical MOS transistor.
Figure 11B:
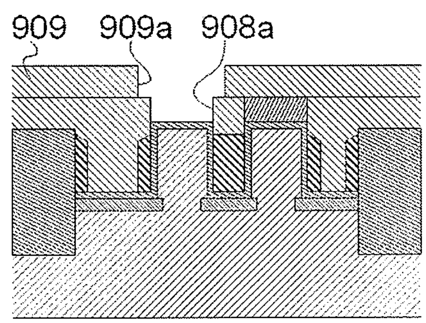
Figure 11C:
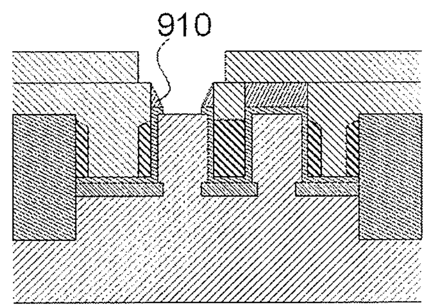
Figure 11D:
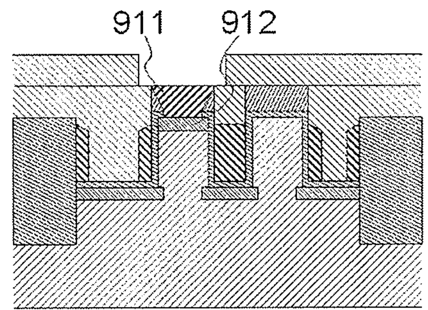
Figure 11E:
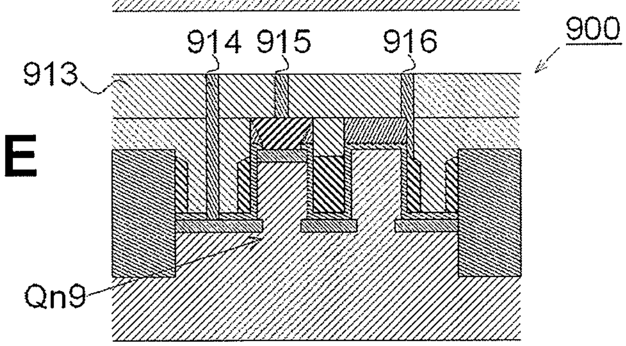
Figure 12:
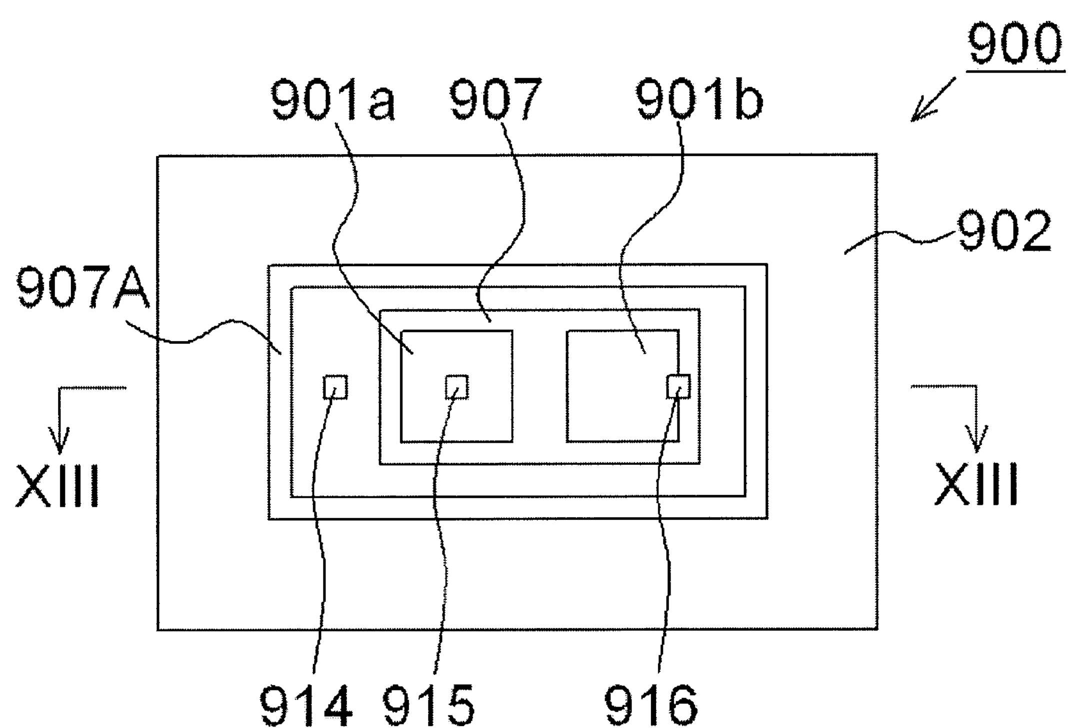
FIG. 12 is a schematic plan view of a vertical MOS transistor.
Figure 13:
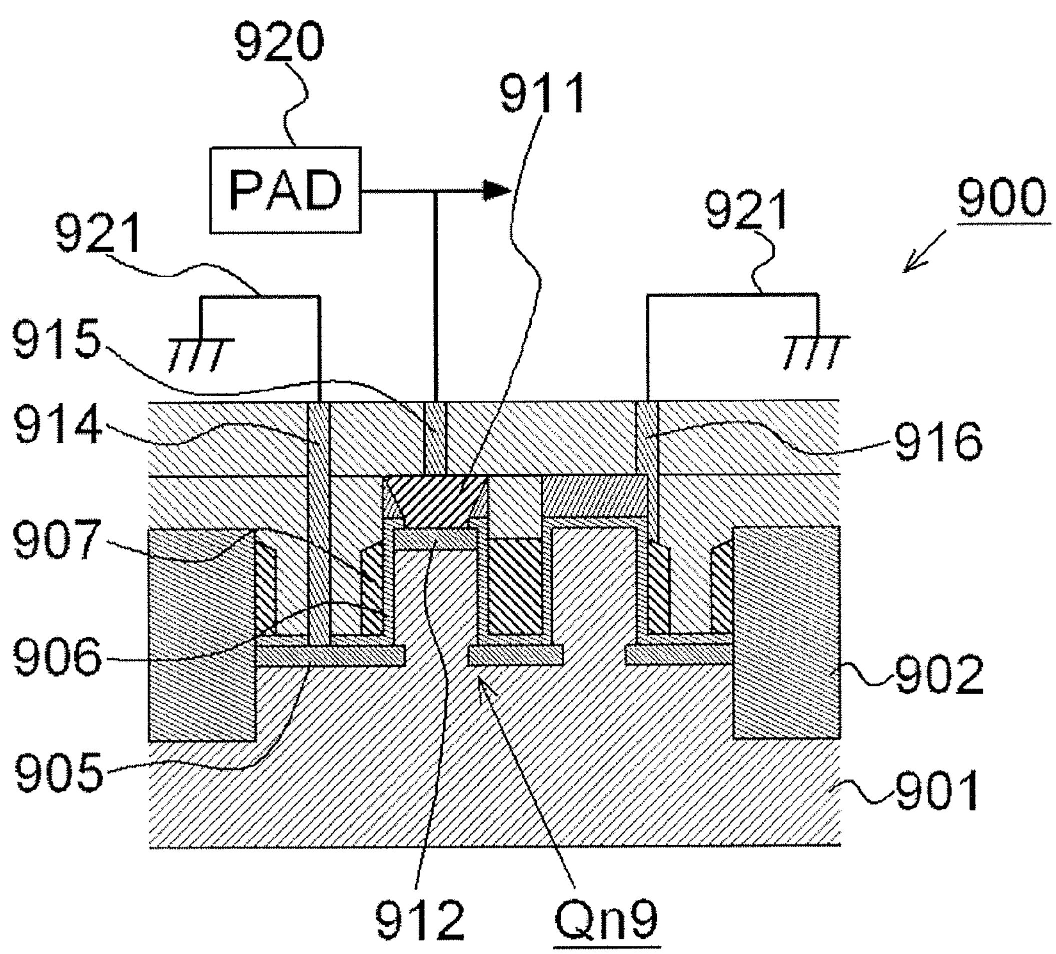
FIG. 13 is a schematic cross section of a vertical MOS transistor for explaining problems to be solved by the present invention.

Next, a semiconductor device according to a fifth exemplary embodiment of the present invention will be described. FIG. 9 shows an example of a circuit diagram of the semiconductor device according to the fifth exemplary embodiment of the present invention. The first to the fourth exemplary embodiments are applied to an electrostatic damage model for static stresses applied from the exterior (a charged body or device) of the semiconductor device, i.e., HBM (Human Body Model) and MM (Machine Model), however, the present exemplary embodiment is applied to an electrostatic damage model CDM (Charged Device Model) where the semiconductor device itself is charged.

In the present exemplary embodiment, a vertical MOS transistor is used as a ESD protection device, and a plurality of the vertical MOS transistors are used for a countermeasure to the CDM. For the countermeasure to the CDM, it is effective to connect a second protection device between gate and source electrodes of a first internal circuit element to which a signal from the pad is connected. In the exemplary embodiment shown in FIG. 9, a first vertical MOS transistor Qn5*a* is the same as the ESD protection device described in the first exemplary embodiment, and a p-channel MOS transistor Qp5*d* (a fourth MOS transistor) and an n-channel MOS transistor Qn5*e* (a fifth MOS transistor) corresponding to the first internal circuit elements are connected to a side (remote from the pad) of a protective resistor. Further, for the countermeasure to the CDM, an n-channel vertical MOS transistor Qn5*b* (a second vertical MOS transistor) and an n-channel vertical MOS transistor Qn5*c* (a third vertical MOS transistor) are connected for the purpose of protecting the fourth MOS transistor Qp5*d* and the fifth MOS transistor Qn5*e*, respectively. The first vertical MOS transistor Qn5*a* is n-channel type. At this time, the lower diffusion layers of the first to the third vertical MOS transistors Qn5*a*, Qn5*b*, and Qn5*c* are electrically connected to the pad 530.

For the p-channel fourth MOS transistor Qp5*d*, the n-channel second vertical MOS transistor Qn5*b* is connected between the pad 530 and a power supply potential wiring 532 so that the fourth MOS transistor Qp5*d* does not get damaged by a potential difference occurring between gate and source electrodes of the fourth MOS transistor Qp5*d* (or the gate electrode and the substrate) when a charged semiconductor device 500 discharges through the pad 530.

For the n-channel fifth MOS transistor Qn5*e*, the n-channel third vertical MOS transistor Qn5*c* is connected between the pad 530 and a ground potential wiring 531 so that the fifth MOS transistor Qn5*e* does not get damaged by a potential difference occurring between the gate and source electrodes of the fourth MOS transistor Qp5*d* (or the gate electrode and the substrate) when the charged semiconductor device 500 discharges through the pad 530.

Since a large voltage is also applied to the second vertical MOS transistor Qn5*b* and the third vertical MOS transistor Qn5*c* brought in as the countermeasure to the CDM at the time of discharge, stable breakdown characteristics and a stable ESD protection function can be maintained by electrically connecting the lower diffusion layer of each vertical MOS transistor to the pad 530.

Further, in the fifth exemplary embodiment, the conductivity types above are merely examples, and a p-channel vertical MOS transistor may be used as the second vertical MOS transistor. In this case, the same effects can be obtained by feeding an input signal connected to the pad to the lower diffusion layers.

The semiconductor device of the present invention has been described based on the exemplary embodiments above, however, the present invention includes various modifications, changes, and improvements of the exemplary embodiments within the scope of the present invention and based on the basic technological concept of the present invention, without being limited to the above exemplary embodiments. Within the scope of the present invention, various combinations, displacements and selections of disclosed elements are available. An ESD protection device may be constituted by applying the present invention using a vertical MOS transistor of any conductivity type, n-channel type or p-channel type.

It should be noted that other problems, objects, and modified modes of the present invention will become apparent in the entire disclosure of the present invention including the claims.

What is claimed is:

1. A semiconductor device, comprising an electrostatic discharge device, said electrostatic discharge device comprising:

a semiconductor substrate of a first conductivity type;

a vertical MOS transistor including a gate electrode formed in said semiconductor substrate, an upper diffusion layer of a second conductivity type formed in said semiconductor substrate on an upper end side of said gate electrode as one of source and drain electrodes, and a lower diffusion layer of said second conductivity type formed in said semiconductor substrate on a lower end side of said gate electrode as the other of said source and drain electrodes;

a first contact plug connected electrically to said lower diffusion layer;

a second contact plug connected electrically to said upper diffusion layer;

a third contact plug connected electrically to said gate electrode;

a pad connected electrically to said first contact plug; and a fixed potential wiring connected electrically to said second contact plug.

2. The semiconductor device as defined in claim 1, wherein said third contact plug is also electrically connected to said fixed potential wiring.

3. The semiconductor device as defined in claim 1, wherein said fixed potential is a ground potential wiring when said first conductive type is a p-type.

4. The semiconductor device as defined in claim 1, said vertical MOS transistor further comprising a first silicon pillar and s second silicon pillar, wherein said gate electrode is formed around sidewalls of said first silicon pillar and said second silicon pillar.

5. The semiconductor device as defined in claim 4, further comprising a gate insulating film formed between said first silicon pillar and said second silicon pillar, and said gate electrode.

6. The semiconductor device as defined in claim 4 wherein said upper diffusion layer is formed on a top of said first silicon pillar, and said lower diffusion layer is formed around a lower part of said first silicon pillar.

7. The semiconductor device as defined in claim 4, wherein said second contact plug is formed on said first silicon pillar.

8. The semiconductor device as defined in claim 4, wherein said third contact plug is formed on said second silicon pillar and said gate electrode.

9. The semiconductor device as defined in claim 4, wherein a diameter of said first silicon pillar is larger than a diameter of said second silicon pillar.

10. The semiconductor device as defined in claim 1, wherein an upper end of said gate electrode is formed at a position independently of a position of a bottom surface of said upper diffusion layer.

11. The semiconductor device as defined in claim 1, wherein a first interval between said first contact plug and said gate electrode is greater than a second interval between said second contact plug and said gate electrode.

12. The semiconductor device as defined in claim 1, further comprising a fourth contact plug connected electrically to a substrate diffusion layer of said first conductive type formed in said semiconductor substrate, wherein said fixed potential wiring is also connected electrically to said fourth contact plug.

13. The semiconductor device as defined in claim 12, further comprising:

a STI insulating film formed in said semiconductor substrate, wherein said substrate diffusion layer is adjacent to said vertical MOS transistor via said STI insulating film.

14. The semiconductor device as defined in claim 1, wherein said pad is also connected electrically to an external terminal that receives or outputs a signal from or to an external source and an internal circuit.

15. The semiconductor device as defined in claim 1, wherein a surge voltage is discharged when said surge voltage is applied to said pad to protect an internal circuit by a breakdown occurred between said lower diffusion layer and said semiconductor substrate.

16. A semiconductor device, comprising an electrostatic discharge device, said electrostatic discharge device comprising:

a semiconductor substrate;

a vertical MOS transistor including a silicon pillar formed in said semiconductor substrate;

a gate electrode formed along a sidewall of said silicon pillar;

a gate insulating film formed between said gate electrode and said silicon pillar;

an upper diffusion layer formed on a top of said silicon pillar as one of source and drain electrodes;

a lower diffusion layer formed lower than said upper diffusion layer on said semiconductor substrate adjacent to said silicon pillar as the other of said source and drain electrodes;

a first contact plug connected electrically to said lower diffusion layer;

a second contact plug connected electrically to said upper diffusion layer;

a third contact plug connected electrically to said gate electrode;

a fourth contact plug connected electrically to a substrate diffusion layer formed in said semiconductor substrate;

a pad connected electrically to said first contact plug; and a fixed potential wiring connected electrically to said second contact plug and said fourth contact plug.

17. The semiconductor device as defined in claim 16, wherein said semiconductor substrate and said substrate diffusion layers are first conductivity type, and said upper diffusion layer and said lower diffusion layer are second conductivity type.

18. The semiconductor device as defined in claim 16, wherein said fixed potential is a ground potential wiring when said first conductive type is a p-type.

19. The semiconductor device as defined in claim 16, further comprising:

a STI insulating film formed in said semiconductor substrate, wherein said substrate diffusion layer is adjacent to said vertical MOS transistor via said STI insulating film.

20. The semiconductor device as defined in claim 16, wherein said second contact plug is formed on said silicon pillar.

21. The semiconductor device as defined in claim 16, wherein said third contact plug is formed on said silicon pillar and said gate electrode.

22. The semiconductor device as defined in claim 16, wherein an upper end of said gate electrode is formed at a position independently of a position of a bottom surface of said upper diffusion layer.

23. The semiconductor device as defined in claim 16, wherein a first interval between said first contact plug and said gate electrode is greater than a second interval between said second contact plug and said gate electrode.

24. The semiconductor device as defined in claim 16, wherein said pad is also connected electrically to an external terminal that receives or outputs a signal from or to an external source and an internal circuit.

25. The semiconductor device as defined in claim 16, wherein a surge voltage is discharged when said surge voltage is applied to said pad to protect an internal circuit by a breakdown occurred between said lower diffusion layer and said semiconductor substrate.

* * * * *